United States Patent [19]
Chung et al.

[11] Patent Number: 5,184,030
[45] Date of Patent: Feb. 2, 1993

[54] BACK BIAS GENERATING CIRCUIT

[75] Inventors: Jin Y. Chung; Deog Y. Kwak, both of Seoul, Rep. of Korea

[73] Assignee: Goldstar Electron Co., Ltd., Choongchungbook, Rep. of Korea

[21] Appl. No.: 813,611

[22] Filed: Dec. 26, 1991

[30] Foreign Application Priority Data

Apr. 12, 1991 [KR] Rep. of Korea ................ 5890/1991

[51] Int. Cl.$^5$ ............................................. H03K 3/01
[52] U.S. Cl. ......................... 307/296.01; 307/296.02; 307/296.08
[58] Field of Search ............... 307/296.1, 296.2, 296.8, 307/264, 269

[56] References Cited

U.S. PATENT DOCUMENTS

| | | | |
|---|---|---|---|
| 4,559,548 | 12/1985 | Iizuka et al. | 307/296.2 |
| 4,628,214 | 12/1986 | Leuschner | 307/296.2 |
| 4,920,280 | 4/1990 | Cho et al. | 307/296.2 |

Primary Examiner—William L. Sikes
Assistant Examiner—Sinh Tran
Attorney, Agent, or Firm—Lowe, Price, LeBlanc & Becker

[57] ABSTRACT

A back bias generating circuit comprising a ring oscillator for generating a signal of alternating current waveform, a back bias generating section for generating a back bias voltage, the back bias generating section including first through third inverter gates for respectively inverting an output voltage from the ring oscillator, a pumping capacitor for inputting an output voltage from the third inverter gate at its one terminal, and a switching transistor for applying an output voltage at the other terminal of the pumping capacitor to a back bias terminal, the other terminal of the pumping capacitor being controlled, in accordance with a level of the output voltage from the ring oscillator, such that it is connected to a ground terminal to generate the back bias voltage, and switching transistor control section for controlling a voltage to be applied to the gate of the switching transistor in accordance with a level of the output voltage from the ring oscillator. In accordance with the present invention, the back bias generating circuit can reduce amount of electrons being injected from the pumping capacitor into a substrate so that malfunction of cells can be prevented, it is suitable for high speed operation and current consumption therein can be reduced.

3 Claims, 4 Drawing Sheets

BACK BIAS GENERATING CIRCUIT

BACKGROUND OF THE INVENTION

1. Field of the Invention

The present invention relates in general to a back bias generating circuit, and more particularly to a back bias generating circuit for reducing amount of electrons being injected from a pumping capacitor into a substrate so that it is suitable for high speed operation and current consumption therein can be reduced.

Description of the Prior Art

With the reference to FIG. 1, there is shown a circuit diagram of a conventional back bias generating circuit. The illustrated circuit comprises a ring oscillator IC1 for generating a signal of alternating current(AC) waveform, the output terminal of which is connected to one terminal of a pumping capacitor PC1 through inverter gates IN1-IN3. The output terminal of the inverter gate IN2 is connected commonly to gates of a PMOS transistor PM1 and an NMOS transistor NM1. The source of the PMOS transistor PM1 is connected to a power source terminal Vcc and the drain thereof is connected to the drain of the NMOS transistor NM1 and to the gate of a NMOS transistor NM2, the source of which is connected to a ground terminal Vss. The other terminal of the pumping capacitor PC1 is connected commonly to the source of the NMOS transistor NM1, the drain of the NMOS transistor NM2 and the drain of a NMOS transistor NM3, the source and gate of which are connected commonly to a back bias terminal $V_{BB}$.

The operation of the conventional back bias generating circuit with the above-mentioned construction will now be described.

First, if the voltage outputted from the ring oscillator IC1 falls to a low level, the low output voltage from the ring oscillator IC1 is inverted into a high level by the inverter gate IN1 and the high-inverted voltage from the inverter gate IN1 is then again inverted into the low level by the inverter gate IN2. The wave-shaped, low voltage from the inverter gate IN2 is applied to the gates of the PMOS and NMOS transistors PM1 and NM1. As a result, the PMOS transistor PM1 is turned on while the NMOS transistor NM1 is turned off, thereby allowing the voltage at the power source terminal Vcc to be applied to the gate of the NMOS transistor NM2 through the PMOS transistor PM1. The voltage at the power source terminal Vcc turns on the NMOS transistor NM2.

On the other hand, the low output voltage from the inverter gate IN2 is inverted into a high level by the inverter gate IN3 and the high-inverted voltage from the inverter gate IN3 is then applied to the one terminal of the pumping capacitor PC1, the voltage at the other terminal of which is bypassed to the ground terminal Vss through the turned-on NMOS transistor NM2. As a result, zero volt voltage, or ground voltage appears at common connection node n1 of the other terminal of the pumping capacitor PC1 with the source and drain of the NMOS transistors NM1 and NM2. In result, the ground voltage at the common connection is applied to the drain of the NMOS transistor NM3, referred hereinafter to as switching transistor.

At this time, minus voltage at the back bias terminal $V_{BB}$ is applied commonly to the gate and source of the switching transistor NM3, thereby causing the switching transistor NM3 to be turned off due to a reverse bias. The turning-off of the switching transistor NM3 prevents the voltage at the back bias terminal $V_{BB}$ from rising.

Thereafter, if the voltage outputted from the ring oscillator IC1 rises to a high level, the high output voltage from the ring oscillator IC1 is inverted into a low level by the inverter gate IN1 and the low-inverted voltage from the inverter gate IN1 is then again inverted into the high level by the inverter gate IN2. The wave-shaped, high voltage from the inverter gate IN2 is applied to the gates of the PMOS and NMOS transistor PM1 and NM1. (As a result, the PMOS transistor PM1 and the NMOS transistor NM2 are turned off while the NMOS transistor NM1 is turned on.)

On the other hand, the high output voltage from the inverter gate IN2 is inverted into a low level by the inverter gate IN3 and the low-inverted voltage from the inverter gate IN3 is then applied to the one terminal of the pumping capacitor PC1. Because of a coupling effect of capacitor, minus voltage appears at the other terminal of the pumping capacitor PC1. Then, as the voltage at the one terminal of the pumping capacitor PC1 gradually falls to the low level, i.e., as the output voltage from the ring oscillator IC1 gradually rises to the high level, the magnitude of the minus voltage at the other terminal of the pumping capacitor PC1 becomes larger such that the minus voltage at the other terminal of the pumping capacitor PC1 is applied is applied to the drain of the switching transistor NM3. At this time, when the level of the voltage at the back bias terminal $V_{BB}$ is higher than that of the minus voltage at the other terminal of the pumping capacitor PC1, the switching transistor NM3 is turned on because of a normal bias. The turning-on of the switching transistor NM3 allows the voltage at the back bias terminal $V_{BB}$ to be bypassed therethrough. As a result, the level of the voltage at the back bias terminal $V_{BB}$ becomes lower.

In other words, since a large quantity of electrons generated from the pumping capacitor PC1 flows through the turned-on switching transistor NM3 to the back bias terminal $V_{BB}$, the level of the voltage at the back terminal $V_{BB}$ becomes relatively lower.

In the conventional back bias generating circuit, however, since the lowest level of voltage generated from the pumping capacitor PC1 continues to be maintained much lower than the level of the voltage at the back bias terminal due to a potential difference $V_T$ between the drain and the source of the switching transistor NM3, electrons being injected from the junction of the pumping capacitor PC1 into the substrate are large in quantity such that they have an effect on information in cells. Namely, the large quantity of electrons results in malfunction of the cells. Also, because the voltage at the back bias terminal is always applied to the gate of the switching transistor NM3, it takes the voltage at the back bias terminal a considerably long time to fall to a desired level due to a small conductance of the switching transistor NM3. This means that the circuit is not suitable for a high speed operation.

SUMMARY OF THE INVENTION

Therefore, it is an object of the present invention to provide a back bias generating circuit for reducing amount of electrons being injected from a pumping capacitor into a substrate into a substrate so that malfunction of cells can be prevented, it is suitable to a high speed operation and current consumption therein can be reduced.

In accordance with the present invention, the above object can be accomplished by providing a back bias generating circuit, comprising: ring oscillating means for generating a signal of alternating current waveform, back bias generating means for generating a back bias voltage, the back bias generating means including first through third inverter gates for respectively inverting an output voltage from the ring oscillating means, a pumping capacitor for inputting an output voltage from the third inverter gate at its one terminal, a switching transistor for applying an output voltage at the other terminal of the pumping capacitor to a back bias terminal, the other terminal of the pumping capacitor being controlled, in accordance with a level of the output voltage from the ring oscillating means, such that it is connected to a ground terminal to generate the back bias voltage, and switching transistor control means for controlling a voltage to be applied to the gate of the switching transistor in accordance with a level of the output voltage from the ring oscillating means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF PREFERRED EMBODIMENTS

First, a construction of a back bias generating circuit of the present invention will be described with reference to FIG. 2.

Figure 1:
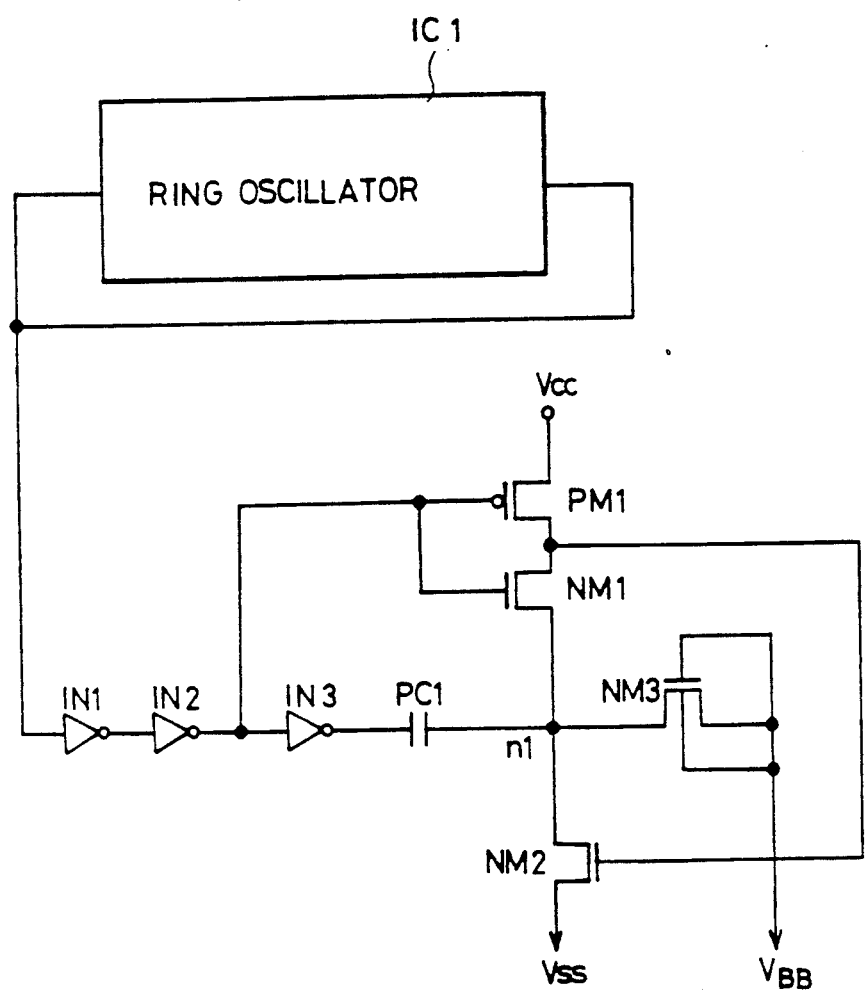
FIG. 1 is a circuit diagram of a conventional back bias generating circuit.
Figure 2:
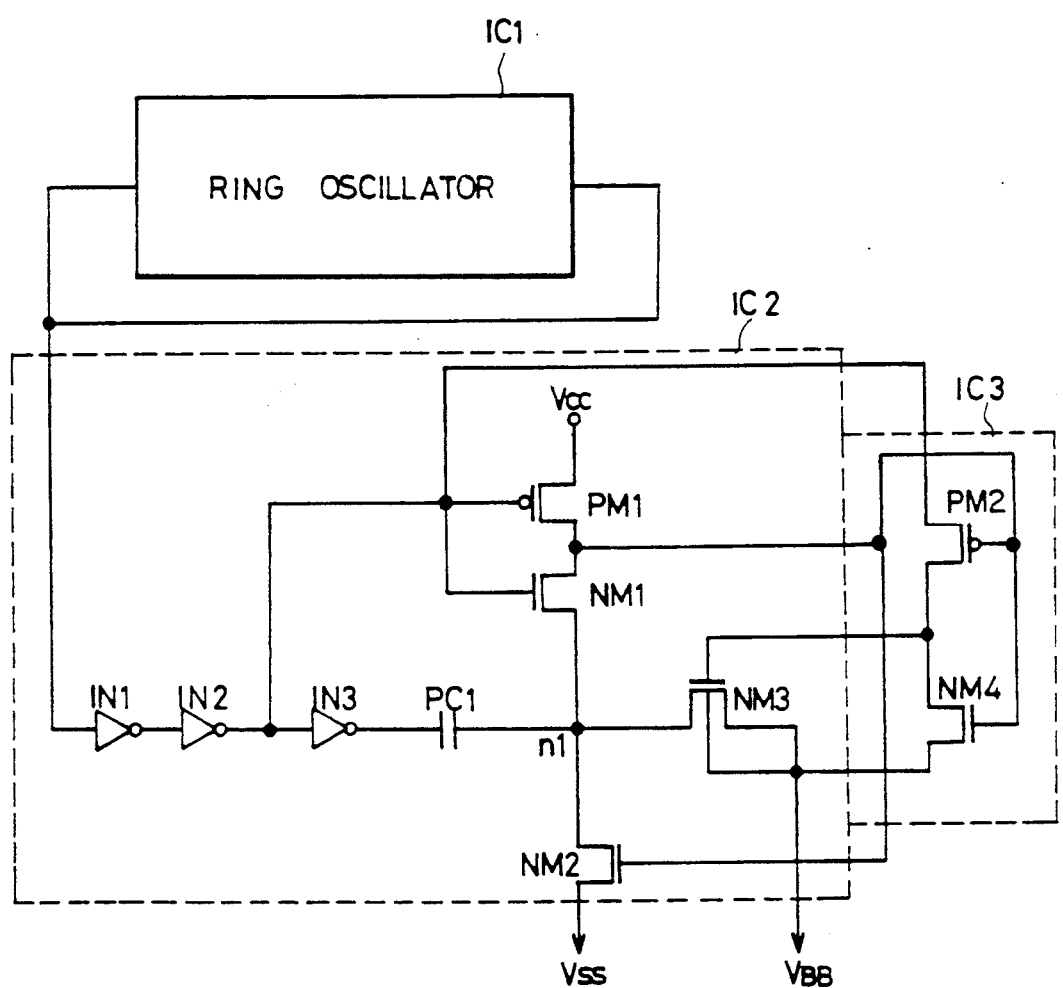
FIG. 2 is a circuit diagram of a back bias generating circuit of the present invention.

With reference to FIG. 2, there is shown a circuit diagram of the back bias generating circuit of the present invention. As shown in this drawing, the back bias generating circuit of the present invention comprises a ring oscillator IC1 for generating a signal of alternating current (AC) waveform, a back bias generating section IC2 for generating a back bias voltage, and a switching transistor control section IC3.

The back bias generating section IC2 includes a plurality of inverter gates IN1-IN3 for respectively inverting an output voltage from the ring oscillator IC1, a pumping capacitor PC1 for inputting an output voltage from the inverter gate IN3 at its one terminal, and a switching transistor NM3 for applying an output voltage at the other terminal of the pumping capacitor PC1 to a back bias terminal $V_{BB}$, the other terminal of the pumping capacitor PC1 being controlled, in accordance with a level of the output voltage from the ring oscillator IC1, such that it is connected to a ground terminal Vss to generate the back bias voltage.

The switching transistor control section IC3 includes a PMOS transistor PM2 for applying a voltage at the ground terminal Vss or a voltage at a power source terminal Vcc to the gate of the switching transistor NM3 in accordance with a level of the output voltage from the ring oscillator IC1, and an NMOS transistor NM4 for applying the back bias voltage to the gate of the switching transistor NM3 in accordance with a level of the output voltage from the ring oscillator IC1. The switching transistor control section IC3 functions to increase a conductance value of the switching transistor NM3 for high speed operation of cells and to reduce an absolute value of the output voltage from the pumping capacitor PC1 so that current consumption in the circuit can be reduced and malfunction of the cells can be prevented.

On the other hand, in the back bias generating section IC2, the output terminal of the ring oscillator IC1 is connected to the one terminal of the pumping capacitor PC1 through the inverter gates IN1-IN3. The output terminal of the inverter gate IN2 is connected commonly to gates of a PMOS transistor PM1 and an NMOS transistor NM1. The source of the PMOS transistor PM1 is connected to the power source terminal Vcc and the drain thereof is connected to the drain of the NMOS transistor NM1 and to the gate of a NMOS transistor NM2, the source of which is connected to the ground terminal Vss. The other terminal of the pumping capacitor PC1 is connected commonly to the source of the NMOS transistor NM1, the drain of the NMOS transistor NM2 and the drain of the switching transistor NM3, the source of which is connected to the back bias terminal $V_{BB}$.

In the switching transistor control section IC3, the output terminal of the inverter gate IN2 in the back bias generating section IC2 is connected to the source of the PMOS transistor PM2. A common connection of the drain of the PMOS transistor PM1 with the drain of the NMOS transistor NM1 in the back bias generating section IC2 is connected commonly to the gate of the PMOS transistor PM2 and the gate of the NMOS transistor NM4. Also, a common connection of the drain of the PMOS transistor PM2 with the drain of the NMOS transistor NM4 is connected to the gate of the switching transistor NM3 in the back bias generating section IC2. The source of the NMOS transistor NM4 is connected in common to the source of the switching transistor NM3 of the back bias generating section IC2 and the back bias terminal $V_{BB}$.

Figure 3:
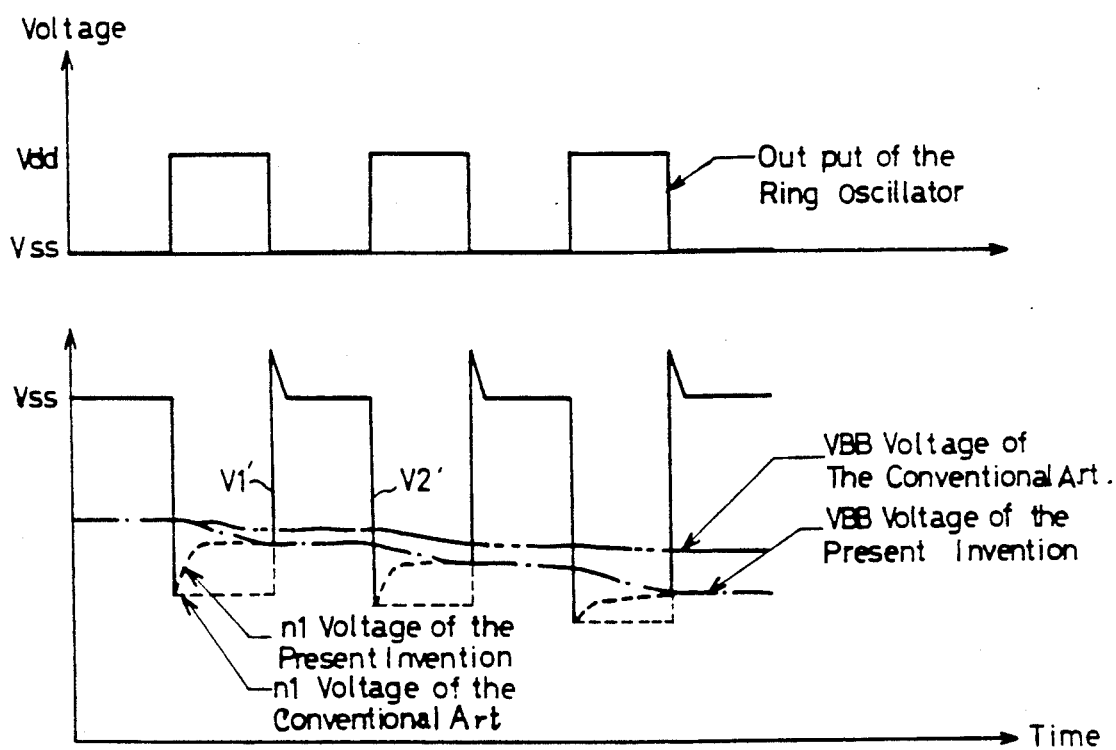
FIG. 3 is a waveform diagram of a voltage outputted from a pumping capacitor in FIG. 2 in accordance with the present invention.

Now, the operation of the back bias generating circuit with the above-mentioned construction in accordance with the present invention will be described in detail with reference to FIGS. 3 and 4.

First, if the voltage outputted from the ring oscillator IC1 falls to a low level, the low output voltage from the ring oscillator IC1 is inverted into a high level by the inverter gate IN1 and the high-inverted voltage from the inverter gate IN1 is then again inverted into the low level by the inverter gate IN2. The wave-shaped, low voltage from the inverter gate IN2 is applied to the gates of the PMOS and NMOS transistors PM1 and NM1 and to the source of the PMOS transistor PM2 in the switching transistor control section IC3. As a result, the PMOS transistor PM1 is turned on while the NMOS transistor NM1 is turned off, thereby allowing the voltage at the power source terminal Vcc to be applied to the gates of the NMOS transistors NM2 and NM4 and to the gate of the PMOS transistor PM2 through the PMOS transistor PM1. The application of the voltage at the power source terminal Vcc turns on the NMOS transistors NM2 and NM4 while turns off the PMOS transistor PM2.

On the other hand, the low output voltage from the invertergate IN2 is inverted into a high level by the inverter gate IN3 and the high-inverted voltage from the inverter gate IN3 is then applied to the one terminal of the pumping capacitor PC1, the voltage at the other terminal of which is bypassed to the ground terminal Vss through the turned-on NMOS transistor NM2. As a result, ground voltage appears at common connection node n1 of the other terminal of the pumping capacitor PC1 with the source and drain of the NMOS transistors NM1 and NM2, as shown in FIG. 3. In result, as the voltage at the one terminal of the pumping capacitor PC1 gradually rises to the high level, the drain of the switching transistor NM3 is applied with the ground voltage at the common connection node n1 rising as denoted a rising edge voltage V1' in FIG. 3.

At this time, the voltage at the back bias terminal $V_{BB}$ is applied directly to the source of the switching transistor NM3 and through the turned-on NMOS transistor NM4 to the gate of the switching transistor NM3, thereby causing the switching transistor NM3 to be turned off due to a reverse bias.

Figure 4:
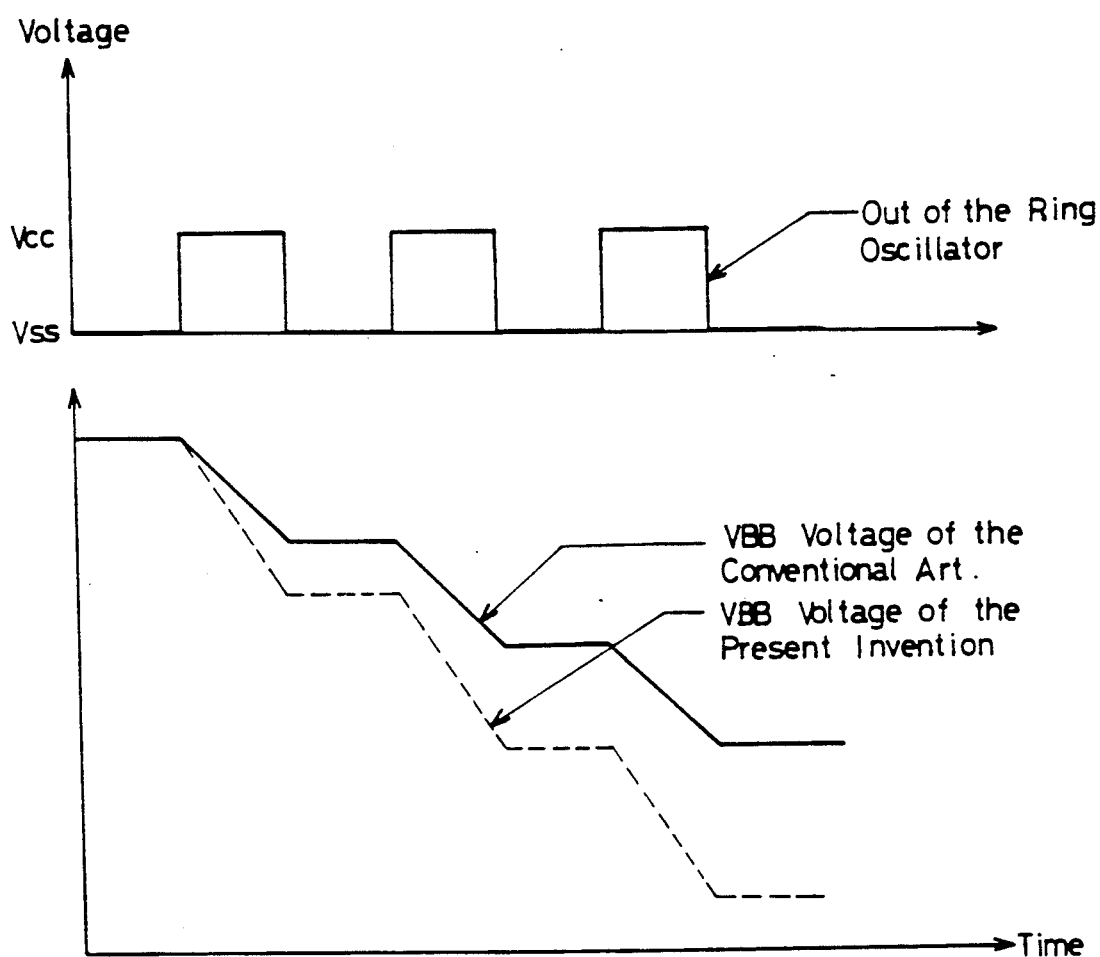
FIG. 4 is a waveform diagram of a voltage at a back bias terminal in FIG. 2 in accordance with the present invention.

As a result, since the voltage at the common connection node n1 is blocked by the turned-off switching transistor NM3, the voltage at the back bias terminal $V_{BB}$ is maintained naturally as shown in FIG. 4.

Thereafter, if the voltage outputted from the ring oscillator IC1 rises to a high level, the high output voltage from the ring oscillator IC1 is inverted into a low level by the inverter gate IN1 and the low-inverted voltage from the inverter gate IN1 is then again inverted into the high level by the inverter gate IN2. The wave-shaped, high voltage from the inverter gate IN2 is applied to the gates of the PMOS and NMOS transistors PM1 and NM1 and to the source of the PMOS transistor PM2. As a result, the PMOS transistor PM1 is turned off while the NMOS transistor NM1 is turned on. Also, since the low voltage at the common connection node n1 is applied to the gate of the PMOS transistor PM2 and to the gates of the NMOS transistors NM2 and NM4 through the turned-on NMOS transistor NM1, the PMOS transistor PM2 is turned on while the NMOS transistors NM2 and NM4 are turned off.

As a result, the high voltage outputted from the inverter gate IN2 is applied to the gate of the switching transistor NM3 through the turned-on PMOS transistor PM2, resulting in turning-on of the switching transistor NM3.

On the other hand, the high output voltage from the inverter gate IN2 is inverted into a low level by the inverter gate IN3 and the low-inverted voltage from the inverter gate IN3 is then applied to the one terminal of the pumping capacitor PC1. Because of a coupling effect of capacitor, a voltage lower than that at the one terminal appears at the other terminal of the pumping capacitor PC1. Then, as the voltage at the one terminal of the pumping capacitor PC1 gradually falls to the low level, the voltage appearing at the common connection node n1 of the other terminal of the pumping capacitor PC1 with the source and drain of the NMOS transistors NM1 and NM2 falls relatively to a minus voltage level V2' as shown in FIG. 3. In result, the minus voltage V2' at the common connection node n1 is applied to the gate of the PMOS transistor PM2 and the drain of the switching transistor NM3 through the turned-on NMOS transistor NM1, thereby allowing the PMOS transistor PM2 to be turned on. This turning on of the PMOS transistor PM2 applies the voltage at the power source terminal Vcc to the gate of the switching transistor NM3.

The turning-on of the switching transistor NM3 allows the voltage at the back bias terminal $V_{BB}$ to be bypassed therethrough to the minus voltage output side of the pumping capacitor PC1. As a result, the level of the voltage at the back bias terminal $V_{BB}$ becomes gradually lower as shown in FIG. 4. Namely, the conductance value of the switching transistor NM3 is larger in the case where the voltage at the power source terminal Vcc or the voltage from the ring oscillator IC1 is applied to the gate of the switching transistor NM3, than that in the case where the voltage at the back bias terminal $V_{BB}$ is applied to the gate of the switching transistor NM3. The larger conductance value of the switching transistor NM3 makes the circuit reach the back bias voltage faster.

Also, at the falling edge point in which the output voltage from the ring oscillator IC1 falls to the low level, i.e., just before the voltage at the common connection node n1 of the other terminal of the pumping capacitor PC1 with the source and drain of the NMOS transistors NM1 and NM2 rises, the low voltage or the voltage at the ground terminal Vss is applied to the gate of the switching transistor NM3, thereby causing an absolute value of the minus voltage V2' being applied to the common connection node n1 to become smaller by a potential difference $V_T$ of the switching transistor NM3. As a result, electrons being injected from the common connection node n1 into the back bias terminal $V_{BB}$ can be reduced in amount.

To explain it in a great detail, when the output voltage from the ring oscillator IC1 falls to the low level, the low output voltage from the ring oscillator IC1 is applied to the gate of the PMOS transistor PM1 and to the gate of the PMOS transistor PM2 through the inverter gates IN1 and IN2, thereby allowing the PMOS transistor PM1 to be turned on. At this time, the turning-on of the PMOS transistor PM1 is delayed during a predetermined period of time, while the PMOS transistor PM2 has been turned on by the minus voltage, or the just previous value at the common connection node n1. As a result, since the low output voltage from the ring oscillator IC1, or the voltage at the ground terminal Vss is applied to the gate of the switching transistor NM3 through the turned-on PMOS transistor PM2, the absolute value of the minus voltage V2' being applied to the common connection node n1 becomes smaller by the potential difference $V_T$ between the drain and source of the switching transistor NM3, as shown in FIG. 3. As a result, electrons being injected from the junction of the pumping capacitor PC1 into the substrate can be rduced in amount, thereby enabling the malfunction of the cells to be prevented.

As hereinbefore described, in accordance with the present invention, the voltage at the power source terminal or the voltage at the ground terminal is applied to the gate of the switching transistor in accordance with the level of the output voltage from the ring oscillator. That is, when the output voltage from the ring oscillator is high, the high voltage is applied to the gate of the switching transistor, resulting in the larger conductance value of the switching transistor. Therefore, the operating speed of the circuit to reach the back bias voltage can become very high. This high operating speed of the circuit provides an advantage for an layout of cell. On the other hand, when the output voltage from the ring oscillator is turned from the high level into the low level, the low voltage, or the voltage at the ground terminal is applied to the gate of the switching transistor. This application of the low voltage to the gate of the switching transistor allows the voltage at the pumping capacitor to become higher by the potential difference of the switching transistor than that in the prior art. Therefore, electrons being injected from the pumping capacitor into the substrate can be reduced in amount, thereby enabling the malfunction of the cells to be prevented.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

We claim:

1. A back bias generating circuit, comprising:
   ring oscillating means for generating a signal of alternating current waveform;
   back bias generating means coupled to said ring oscillating means for generating a back bias voltage;
   said back bias generating means including first through third inverter gates for respectively inverting the signal from said ring oscillating means, a pumping capacitor for receiving at one terminal an output voltage from said third inverter gate, and a switching transistor having a gate and first and second conduction terminals for applying an output voltage at the other terminal of said pumping capacitor to a back bias terminal, said other terminal of said pumping capacitor being controlled, in accordance with a level of said signal from said ring oscillating means, such that said other terminal is connected to a ground terminal; and
   switching transistor control means for controlling a voltage to be applied between the gate and one of said conduction terminals of said switching transistor for switching said switching transistor in accordance with a level of said signal from said ring oscillating means.

2. A back bias generating circuit, as set forth in claim 1, wherein said switching transistor control means includes:
   a PMOS transistor for applying a voltage at the ground terminal or a voltage at a power source terminal to the gate of said switching transistor in accordance with a level of the output voltage from said ring oscillating means; and
   an NMOS transistor for applying the back bias voltage to the gate of said switching transistor in accordance with a level of the output voltage from said ring oscillating means.

3. A back bias generating circuit, as set forth in claim 2, wherein said PMOS transistor includes its source connected to the output terminal of said second inverter gate in said back bias generating means, its gate connected to a common connection of the drain of a different PMOS transistor with the drain of a different NMOS transistor in said back bias generating means and its drain connected to the gate of said switching transistor in said back bias generating means; and
   said NMOS transistor includes its gate connected to the common connection of the drain of said different PMOS transistor with the drain of said different NMOS transistor in said back bias generating means, its drain connected to the gate of said switching transistor in said back bias generating means, and its source connected in common to the source of the switching transistor in the back bias generating means and the back bias terminal.

* * * * *